United States Patent
Pease

(10) Patent No.: US 9,937,512 B2
(45) Date of Patent: Apr. 10, 2018

(54) INTEGRATED MULTICOAT AUTOMATIC PAUSE RESUME CIRCUIT

(75) Inventor: John R. Pease, Ashford, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 864 days.

(21) Appl. No.: 13/367,844

(22) Filed: Feb. 7, 2012

(65) Prior Publication Data

US 2013/0202780 A1    Aug. 8, 2013

(51) Int. Cl.

| C23C 4/12 | (2016.01) |
|---|---|
| B05B 7/22 | (2006.01) |
| B05C 11/00 | (2006.01) |
| B05B 12/08 | (2006.01) |
| H01H 1/42 | (2006.01) |
| B05B 12/12 | (2006.01) |
| C23C 4/134 | (2016.01) |
| B05C 11/10 | (2006.01) |
| C23C 16/52 | (2006.01) |
| C23C 14/54 | (2006.01) |
| B05B 7/20 | (2006.01) |

(52) U.S. Cl.
CPC ............ *B05B 12/085* (2013.01); *B05B 12/12* (2013.01); *C23C 4/12* (2013.01); *C23C 4/134* (2016.01); *H01H 1/42* (2013.01); *B05B 7/20* (2013.01); *B05B 7/22* (2013.01); *B05C 11/1013* (2013.01); *C23C 14/54* (2013.01); *C23C 16/52* (2013.01)

(58) Field of Classification Search
None
See application file for complete search history.

(56) References Cited

U.S. PATENT DOCUMENTS

| 3,988,566 | A | * | 10/1976 | Vogts et al. ............... 219/121.47 |
|---|---|---|---|---|
| 5,429,682 | A |   | 7/1995 | Harlow, Jr. et al. |
| 5,455,894 | A |   | 10/1995 | Conboy et al. |
| 5,879,753 | A | * | 3/1999 | Zajchowski et al. ......... 427/446 |
| 5,999,106 | A | * | 12/1999 | Buckler ................... 340/870.09 |
| 6,491,967 | B1 | * | 12/2002 | Corderman et al. .......... 427/446 |
| 7,112,758 | B2 |   | 9/2006 | Ma et al. |
| 7,332,036 | B2 | * | 2/2008 | Vardelle ............... B23K 10/006 118/664 |
| 2004/0031776 | A1 | * | 2/2004 | Gevelber et al. ........ 219/121.36 |
| 2005/0016705 | A1 |   | 1/2005 | Collins |
| 2005/0241576 | A1 | * | 11/2005 | Gaon et al. .................... 118/665 |
| 2006/0198944 | A1 | * | 9/2006 | Gevelber .............. B05B 12/082 118/679 |
| 2006/0228465 | A1 | * | 10/2006 | Zurecki ............................. 427/8 |
| 2009/0235864 | A1 | * | 9/2009 | Khoury et al. ............... 118/668 |

FOREIGN PATENT DOCUMENTS

WO    WO 2008/135290 A1    11/2008

\* cited by examiner

*Primary Examiner* — Binu Thomas
(74) *Attorney, Agent, or Firm* — Cantor Colburn LLP

(57) ABSTRACT

The present disclosure sets forth an automated apparatus and method for applying gas plasma coatings to aircraft engine parts. The process and apparatus employ a plurality of sensors which continually monitor various process parameters associated with the coating process. If any of the measured parameters fall out of tolerance, the coating process is interrupted to allow a user to fix the source of the problem, where upon the process is reengaged. Moreover, the process and apparatus employ a pause resume circuit which uses predetermined durations for pausing and resuming the coating process.

9 Claims, 3 Drawing Sheets

INTEGRATED MULTICOAT AUTOMATIC PAUSE RESUME CIRCUIT

FIELD OF THE DISCLOSURE

The present disclosure generally relates to aircraft engine parts, and more particularly relates to plasma coating of aircraft engine parts.

BACKGROUND OF THE DISCLOSURE

In the manufacture of various aircraft engine parts, very complex plasma coating and heat treatment processes must be performed on the parts. For example, in the manufacture of turbines, airfoils, and other components of an aircraft, plasma coating must be performed to exacting standards. In so doing, multiple coating parameters, sometimes in excess of ten or more parameters, must be constantly monitored to ensure that the coating process is being performed within tolerance of the specific recipe required for the application. Any deviation from those tolerances will result in a part which does not meet specification and either must be scrapped or reworked.

Currently, such monitoring of the various process parameters is performed manually. Sensors may be provided to measure the various coating parameters, but a human operator must continually monitor the outputs of those sensors to ensure they are within tolerance. If a fault is detected, i.e. if one of the parameters falls out of tolerance, the human operator must manually stop production, determine the source of the fault, fix the fault, and restart the process. This is accordingly very time consuming and if done repetitively over time, can become tedious and thus lead to human error. Moreover, as the parameters must be monitored constantly, a single human operator can only be responsible for a single coating bay or booth, thus increasing labor requirements of the overall assembly process.

SUMMARY OF THE DISCLOSURE

In accordance with one aspect of the disclosure, an apparatus for plasma coating aircraft engine parts is therefore disclosed which may include a spray unit, a plurality of sensors and a controller. The plurality of sensors sense a plurality of process parameters associated with the coating, and the controller includes a pause/resume circuit that is communicatively coupled to the plurality of sensors.

In accordance with another aspect of the disclosure, a method for plasma coating aircraft engine parts is disclosed which may include the steps of providing an apparatus having a spray unit, a plurality of sensors and a controller wherein the plurality of sensors sense a plurality of coating process parameters and the controller includes a pause/resume circuit that is communicatively coupled to the plurality of sensors, pausing the coating once one of the plurality of process parameters falls out of tolerance, and resuming the coating once the plurality of process parameters are back within tolerance.

In accordance with another aspect of the disclosure, an apparatus for plasma coating aircraft engine parts is disclosed which may comprise a plurality of sensors sensing a plurality of coating process parameters selected from that group consisting of current, voltage, power, process gas pressure, carrier gas pressure, part feed rate, air flow, vibration level, water temperature, and water conductivity; a robotic spray unit; and a controller including a pause/resume circuit that is communicatively coupled to the plurality of sensors and the robotic spray unit. The pause/resume circuit automatically pauses operation of the robotic spray unit when one of the coating process parameters is out of tolerance, and automatically resumes operation of the robotic spray unit when the coating process parameters are within tolerance.

These and other aspects and features of the disclosure will become more apparent upon reading the following detailed description when taken in conjunction of the accompanying drawings.

While the following detailed description will be made with reference to certain exemplary embodiments, it is to be understood that the scope of the disclosure is not to be so limited. Rather, the scope of the disclosure is intended to include not only that specifically set forth in the following detailed description, but that which is fairly encompassed by equivalents thereof, and captured by the appended claims.

DETAILED DESCRIPTION

Figure 1:
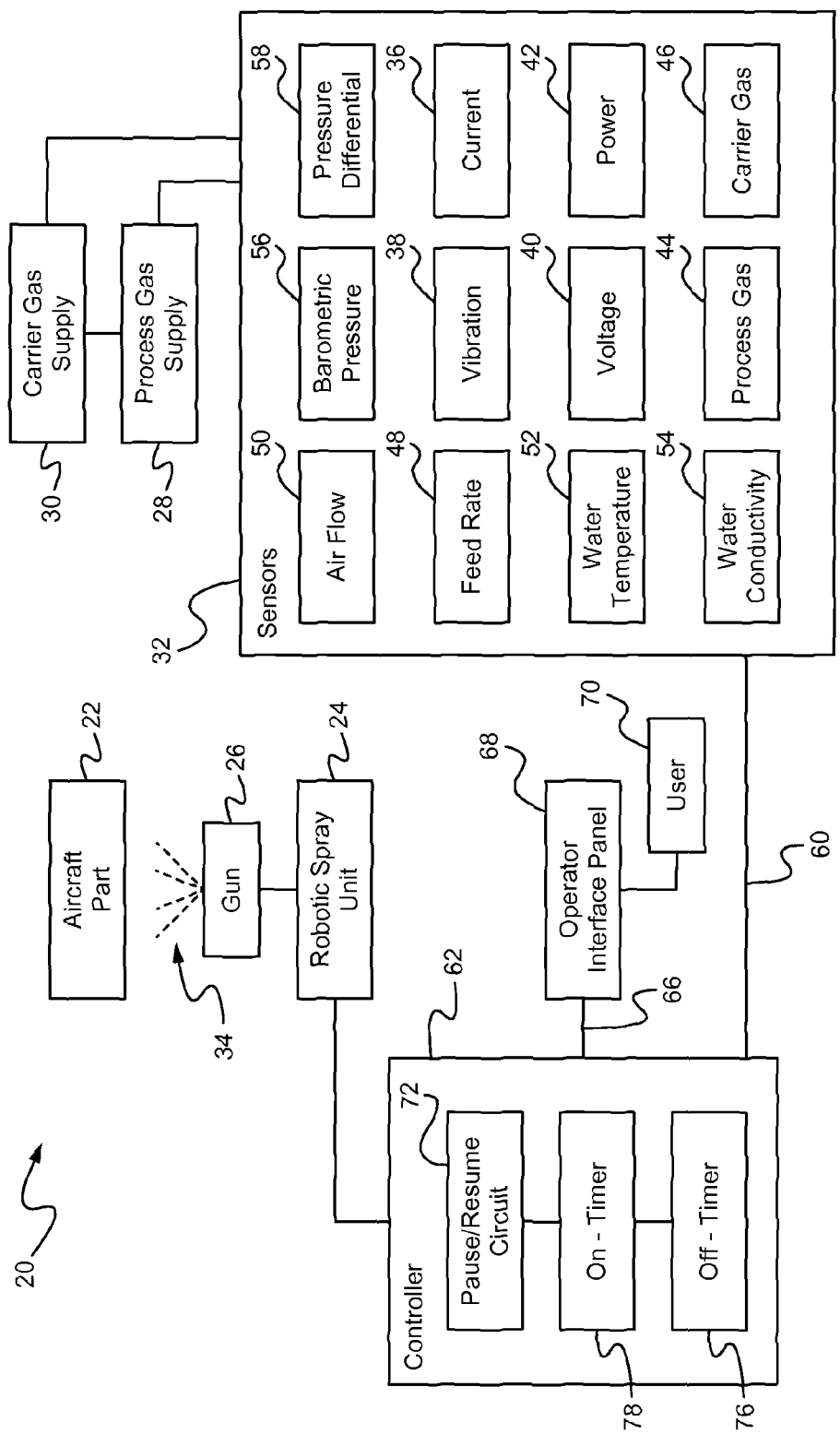
FIG. 1 is a block diagram of an apparatus for plasma coating aircraft engine parts constructed in accordance with the teachings of the disclosure.

Referring now to the drawings, with specific reference to FIG. 1, an apparatus 20 for plasma coating aircraft engine parts 22 is shown in schematic fashion. The part 22 can be any number in different components used on an aircraft such as, but not limited to, turbines, airfoils, fuselages and the like. In addition, while the following detailed description will be made with reference to gas plasma coating of such parts 22, it should be understood that the teachings of the present disclosure, specifically that with respect to the pause/resume circuit, can be similarly employed with respect to various other coatings, heat treatments, or other processes applied to the parts 22.

Referring again to FIG. 1, the apparatus 20 is shown to include a robotic or otherwise automated spray unit 24 having a gun 26 adapted to apply a gas plasma treatment or other process on the part 22. The robotic spray unit 24 is in fluid communication with various gases to effect the gas plasma coating including process gases 28 and carrier gases 30. While the process gases 28 and carrier gases 30 are shown in a singular fashion in FIG. 1, it is to be understood that in actual practice, multiple types of process and carrier gases can be, and are likely, employed. For example, four different process gases and four different carrier gases may be used to create the specific recipe applied by the robotic spray unit 24. Those gases may include, but not be limited to, argon, nitrogen and hydrogen.

It order to ensure that the gas plasma or the other coating applied to the part 22 is applied correctly, the apparatus 20 may also include a plurality of sensors 32 adapted to sense various process parameters associated with the application of the coating 34 to the part 22. Those sensors 32 can include, but are not limited to, current sensors 36, vibration sensors 38, voltage sensors 40, power sensors 42, process gas pressure sensors 44, carrier gas pressure sensors 46, part feed rate sensors 48, air flow sensors 50, water temperature sensors 52, water conductivity sensors 54, barometric pressure sensors 56 and pressure differential sensors 58. Each of these sensors 32 continually monitors the various parameters associated therewith, and generates a signal 60 indicative of the measured parameter to a controller 62.

The controller 62 then compares the measured signal 60 to an acceptable tolerance range. "Acceptable tolerance range", "within tolerance", and "out of tolerance" are defined herein as predetermined values or ranges for the various sensed parameters suitable to result in the proper application of the coating. If the measured signal 60 is within the tolerance range, the controller 62 continues to enable the robotic spray unit 24 to apply the coating 34 to the part 22. However, it is to be understood that this is a continual comparison of not just one signal, but each of the signals received from the various sensors 32 to each of the tolerance ranges associated with each parameter. Concurrent with allowing the robotic spray unit 24 to continue application of the coating 34, output signals 66 are sent by the controller 62 to an operator interface panel 68 to allow for a user 70 to monitor the various sensed parameters as well.

As will be described in further detail with respect to FIG. 3, if one of the sensed parameters as indicated by signal 60 is out of tolerance, the controller 62 engages a pause/resume circuit 72 to disengage the robotic spray unit 24 until the sensed parameter is back within tolerance range. More specifically, the pause/resume circuit 72 disengages operation of the robotic spray unit 24 for a predetermined duration as measured by an off-timer 76. After completion of the predetermined range 74, the controller 62 then again compares the measured parameter to the tolerance range. If the measured parameter is within tolerance, the controller 62 reengages the robotic spray unit 24 to allow the coating 34 to again be applied to the part 22. In order to do so, the resume circuit 72 employs an on-timer 78, which lasts for predetermined duration. After completion of the predetermined duration, the robotic spray unit 24 reengages. Again, this process is continual in that every time a sensed parameter is out of tolerance, the pause/resume circuit comes into play.

As will be noted above, the apparatus 20 fully automates the process of applying gas plasma coatings to an aircraft engine part 22 by measuring various process parameters associated with the coating process, and if any are out of tolerance, disengaging the gas plasma spray unit. This is a significant departure compared to the prior art which requires a single user to manually monitor the sensed parameters, and if any are out of tolerance, to immediately and manually cause the coating process to discontinue. The user then has to fix whatever problem is causing the sensed parameter to be out of tolerance, and then measure the sensed parameter again. Assuming it is back within tolerance, the user then has to manually restart the coating application process. Given the number of sensors and process parameters associated with the gas plasma coating process, such a prior art monitoring system largely occupies the time of a user, thus resulting in significant labor costs and decreased production. Moreover, given the manual component of the monitoring process, the process might become tedious and thus cause human error.

Figure 2:
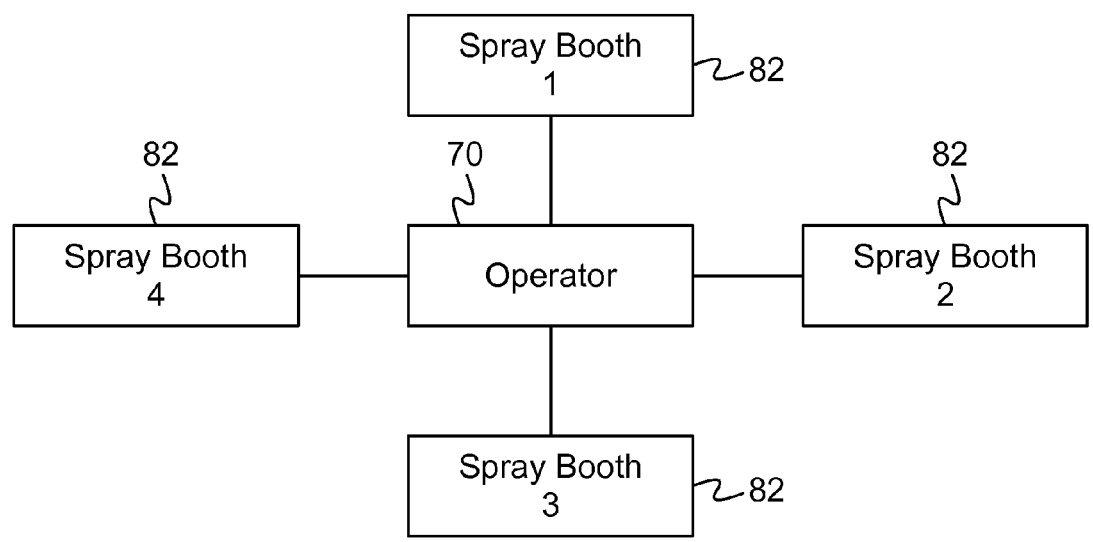
FIG. 2 is a perspective view of the exemplary embodiment of an apparatus for a plasma coating aircraft engine parts constructed in accordance with the teachings of the disclosure.

However, FIG. 2 depicts one of the significant improvements afforded by the teachings of the present disclosure. As shown herein, a single user 70 can simultaneously monitor multiple spray booths 82, each of which are continually applying gas plasma coatings 34 to parts 22. The overall process is therefore greatly improved in terms of productivity, but also in terms of quality in that human error does not play nearly as significant a role in the coating process since much of the coating process is automated. Rather, a single user can simply and periodically monitor the operator panel 68 to ensure the process is being conducted as appropriate. Moreover, while four gas plasma spray booths 82 are depicted in FIG. 2, it is to be understood that given the teachings of the present disclosure, a greater or lesser number of the spray booths can of course be monitored by a single user 70.

Figure 3:
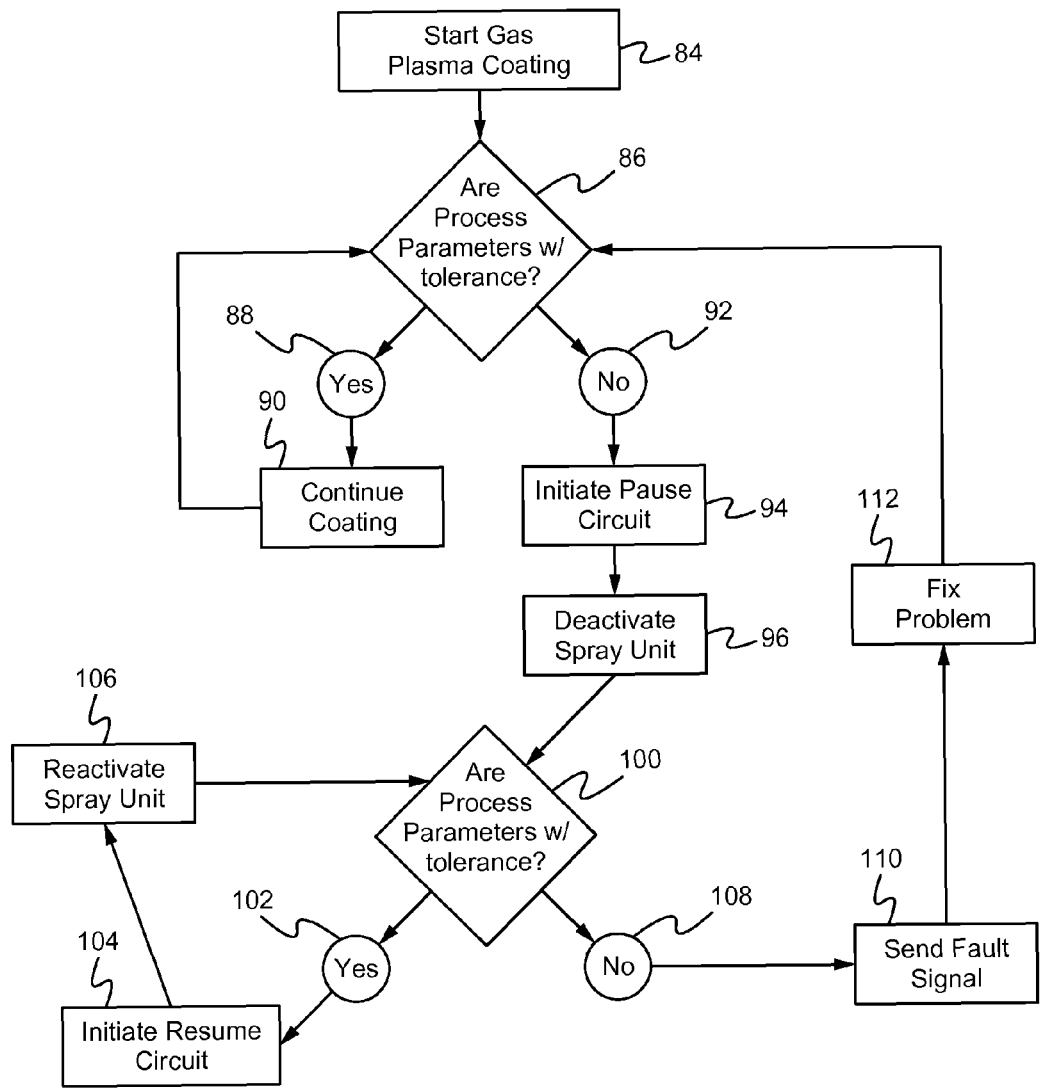
FIG. 3 is a flow chart depicting a sample sequence of steps which may be practiced in accordance with the teachings of the disclosure.

Referring now to FIG. 3, sample sequence of steps which can be conducted in accordance with the teachings of the present disclosure are depicted. Starting with step 84, the process begins by commencing application of the gas plasma coating 34 to the part 22. Immediately the various process parameters associated with the process are monitored by the various sensors 32 as depicted in step 86. If the process parameters as sensed are within tolerance as indicated by step 88, the gas plasma coating process is continued as indicated by step 90.

However, if the process parameters are out of tolerance as indicated by step 92, the pause/resume circuit 72 is initiated as indicated by step 94. This involves the deactivation of the robotic spray unit 24 as indicated by step 96. The predetermined duration of the pause cycle is then measured after which the controller 62 again compares the measured process parameters to the acceptable tolerance range as indicated by step 100.

If the measured processed parameters are then determined to be within tolerance as indicated by step 102, the resume circuit 72 is initiated as indicated by step 104. This entails measuring the predetermined duration of the resume circuit 72 after which the robotic spray unit 24 is reactivated as indicated by step 106. After reactivation, the process restarts in that the various process parameters are continually measured to determine if they are continuing to stay within tolerance.

However, if at any time the processed parameters are determined to be out of tolerance 100 as measured by step 108, output signal 66 is sent to operator interface panel 68 as indicated by step 110. This alerts the user 70 to fix or alleviate whatever problem is causing the process parameter to be out of tolerance as indicated by step 112. After the problem is fixed, the process reverts back to the process of comparing the measured process parameters to determine if they were within the tolerance range associated with that parameter.

While the predetermined durations for the pause circuit and resume circuit 72 will be variable and dependent upon the actual process or coating process being applied to a given part, in one particular embodiment, the predetermined duration of the pause circuit may be about 10 seconds and the predetermined duration of the resume circuit may be about 4 seconds. Of course, as indicated above, other times are certainly possible.

INDUSTRIAL APPLICABILITY

In light of the foregoing, it can be seen that the teachings of the present disclosure can find industrial applicability in the application of various coatings to aircraft engine parts. Such parts can include but not be limited to turbine blades, airfoils, fuselages and the like. Such processes can be, but are not limited to, gas plasma coating and heat treatments. The apparatus and process provide a mechanism by which multiple process parameters associated with the coating process are continually and automatically measured and compared to predetermined tolerance ranges, and only if they are continually within those tolerance ranges, will the coating process continue. If at any time the measured process parameters fall out of tolerance, the coating process is interrupted until the process parameters are fixed and back within range. By automating the process, the time of the user is greatly alleviated and a single user can monitor multiple coating or spray booths as compared to the prior art which requires a single user to constantly monitor a single spray booth. The present disclosure not only improves productivity, but quality as well in that human error has historically played a part in malformed parts, which either cause rework or scrapping of parts or poor performances with respect to the resulting aircraft.

What is claimed is:

1. An apparatus for plasma coating of an aircraft engine part, the apparatus consisting of:
    a spray unit;
    a plurality of sensors, the plurality of sensors sensing a plurality of process parameters for plasma coating of the aircraft engine part, the plurality of process parameters selected from the group of parameters consisting of: vibration levels, current, voltage, power, process gas pressure, carrier gas pressure, part feed rate, air flow, water temperature and water conductivity, wherein the plurality of process parameters has a corresponding plurality of tolerance ranges; and
    a controller including a pause/resume circuit communicatively coupled to the plurality of sensors and the spray unit, the pause/resume circuit repeatedly:
    continuously during operation of the spray unit comparing the plurality of process parameters against the plurality of tolerance ranges and pausing operation of the spray unit in response to determining that one or more of the plurality of process parameters are out of one or more of the plurality of tolerance ranges,
    repeatedly waiting a first time interval to determine whether all of the plurality of process parameters are within the plurality of tolerance ranges, and
    resuming operation of the spray unit during a second time interval in response to determining that all of the plurality of process parameters are within the plurality of tolerance ranges.

2. The apparatus of claim 1, wherein the plurality of sensors includes a vibration sensor.

3. The apparatus according to claim 1, wherein the plurality of sensors further includes a pressure sensor.

4. The apparatus according to claim 1, wherein the plurality of sensors includes a process gas sensor.

5. The apparatus according to claim 1, wherein the plurality of sensors includes a feed rate sensor.

6. The apparatus according to claim 1, wherein the controller controls the spray unit in response to at least one of the plurality of process parameters.

7. The apparatus according to claim 1, wherein the pause/resume circuit of the controller further comprises:
    an on-delay timer having a predetermined duration for pausing the plasma coating of the aircraft engine part; and
    an off-delay timer having a predetermined duration for resuming the plasma coating of the aircraft engine part.

8. The apparatus according to claim 7, wherein the predetermined duration for the on-delay timer of the pause/resume circuit is about 10 seconds, and the predetermined duration for the off-delay timer of the pause/resume circuit is about 4 seconds.

9. The apparatus according to claim 1, wherein the spray unit includes a robotic arm.

* * * * *